(12) United States Patent
Goto et al.

(10) Patent No.: US 8,294,069 B2
(45) Date of Patent: Oct. 23, 2012

(54) HEATING DEVICE FOR HEATING A WAFER

(75) Inventors: Yoshinobu Goto, Nagoya (JP); Hisakazu Okajima, Nishikasugai-Gun (JP)

(73) Assignee: NGK Insulators, Ltd., Nagoya (JP)

( * ) Notice: Subject to any disclaimer, the term of this patent is extended or adjusted under 35 U.S.C. 154(b) by 1136 days.

(21) Appl. No.: 12/053,791

(22) Filed: Mar. 24, 2008

(65) Prior Publication Data
US 2008/0237221 A1     Oct. 2, 2008

(30) Foreign Application Priority Data

Mar. 28, 2007   (JP) .................. 2007-085609

(51) Int. Cl.
*H05B 3/44*   (2006.01)
(52) U.S. Cl. .................. 219/544; 219/443.1; 219/444.1; 118/725
(58) Field of Classification Search ............ 219/543, 219/544, 443.1, 444.1, 546, 547, 548; 118/724, 118/725
See application file for complete search history.

(56) References Cited

U.S. PATENT DOCUMENTS

| | | | | |
|---|---|---|---|---|
| 5,688,331 A | * | 11/1997 | Aruga et al. .................. | 118/725 |
| 6,423,949 B1 | * | 7/2002 | Chen et al. .................. | 219/444.1 |
| 6,997,993 B2 | | 2/2006 | Yamaguchi et al. | |
| 2002/0155262 A1 | * | 10/2002 | Ito et al. ........................ | 428/209 |
| 2002/0170679 A1 | * | 11/2002 | Yamaguchi et al. ..... | 156/345.51 |
| 2003/0094447 A1 | * | 5/2003 | Yamaguchi ................ | 219/444.1 |
| 2003/0183340 A1 | * | 10/2003 | Yamaguchi et al. ..... | 156/345.51 |
| 2003/0183341 A1 | * | 10/2003 | Yamaguchi et al. ..... | 156/345.52 |

FOREIGN PATENT DOCUMENTS

| | | |
|---|---|---|
| JP | 2002-373837 A1 | 12/2002 |
| JP | 2003-224044 A1 | 8/2003 |
| JP | 2004-022382 A1 | 1/2004 |
| JP | 2004-247745 A1 | 9/2004 |

* cited by examiner

*Primary Examiner* — Henry Yuen
*Assistant Examiner* — John Wasaff
(74) *Attorney, Agent, or Firm* — Burr & Brown

(57) ABSTRACT

A heating device made of ceramics includes: a plate-like heating base having a heating surface; and a hollow cylindrical support member bonded to a back surface of the heating base. A concave surface portion that connects the back surface of the heating base and an outer surface of the support member smoothly to each other is formed in the vicinity of an outer end of a bonding interface between the heating base and the support member. On a cross section including an axis of the support member, the concave surface portion has a curved line of an arc of a ellipsoid in which a minor axis direction is parallel to an axis direction of the support member.

2 Claims, 2 Drawing Sheets

HEATING DEVICE FOR HEATING A WAFER

CROSS REFERENCE TO RELATED APPLICATIONS

This application is based upon and claims the benefit of priority from Patent Application No. 2007-085609 filed on Mar. 28, 2007, in the Japanese Patent Office, of which contents are incorporated herein by reference.

BACKGROUND OF THE INVENTION

1. Field of the Invention

The present invention relates to a heating device made of ceramics, and more specifically, relates to a heating device for heating a wafer to be used as a substrate in a manufacturing process of a semiconductor device or heating other plate-like heating objects.

2. Description of the Related Art

In a manufacturing process of a semiconductor device, which uses a semiconductor manufacturing apparatus, heating treatment is implemented for forming an oxide film and the like on a wafer. As the heating device for heating the wafer, there is a heating device that includes a disc-like ceramic base having a heating surface opposite to the wafer as a heating object, in which a resistance heating element is embedded in the ceramic base. This heating device is suitable not only for a deposition apparatus in the manufacturing process of the semiconductor device but also advantageously for a surface treatment apparatus that performs dry etching for a surface of the heating object, and the like.

There is a heating device that further includes a support member for supporting the ceramic base, in which the support member is bonded to the ceramic base. This support member has a substantially cylindrical shape, in which one end surface is fixedly attached to an opposite surface of the ceramic base with the heating surface, that is, to a back surface thereof by solid-phase bonding or liquid-phase bonding.

With regard to such an attachment structure of the ceramic base and the support member, there is a heating device in which a rounded portion is provided between a bonding surface of the ceramic base and an outer circumferential surface of the support member (Japanese Patent Laid-Open Publication No. 2004-247745).

In such a conventional ceramic heater of Japanese Patent Laid-Open Publication No. 2004-247745 mentioned above, the back surface of the ceramic base and the outer circumferential surface of the support member are connected smoothly to each other by a curved surface of the rounded portion formed on a bonded portion between both thereof. An occurrence of a crack is suppressed by this rounded portion. However, the crack has sometimes occurred from the rounded portion concerned even if the rounded portion is present. When the crack occurs, there has been an apprehension that a thermal stress caused by heating and cooling the ceramic base at the time of using the heating device may be concentrated on a portion where the crack has occurred, whereby expansion of the crack may be brought.

In this connection, it is an object of the present invention to provide a heating device that effectively prevents the crack from occurring in the vicinity of the bonded portion between the ceramic base and the support member, thus making it possible to enhance reliability of the heating device concerned.

SUMMARY OF THE INVENTION

In order to achieve the above-described object, a heating device made of ceramics, of the present invention includes: a plate-like heating base having a heating surface; and a hollow cylindrical support member bonded to a back surface of the heating base so that an axis direction thereof can be substantially perpendicular to the back surface, wherein a concave surface portion that connects the back surface of the heating base and an outer surface of the support member smoothly to each other is formed in a vicinity of a bonded portion between the heating base and the support member, and on a cross section including an axis of the support member, the concave surface portion has a curved line of an arc of a ellipsoid in which a minor axis direction is parallel to the axis direction of the support member, and in the concave surface portion, a ratio B/A of the major axis radius B of the ellipsoid with respect to the minor axis radius A of the ellipsoid is 1.5 or more on the cross section including the axis of the support member. The base and the support member are made of ceramics.

In accordance with the heating device of the present invention, the crack is suppressed from occurring in the vicinity of the bonded portion between the heating base and the support member, thus making it possible to enhance the reliability of the heating device concerned.

BRIEF DESCRIPTION OF THE DRAWINGS

The above and further objects, features and advantages of the invention will more fully appear in the detailed description of embodiments of the invention, when the same is read in conjunction with the drawings, in which.

DETAILED DESCRIPTION OF THE INVENTION

A description will be made below of embodiments of a heating device of the present invention by using the drawings.

Figure 1:
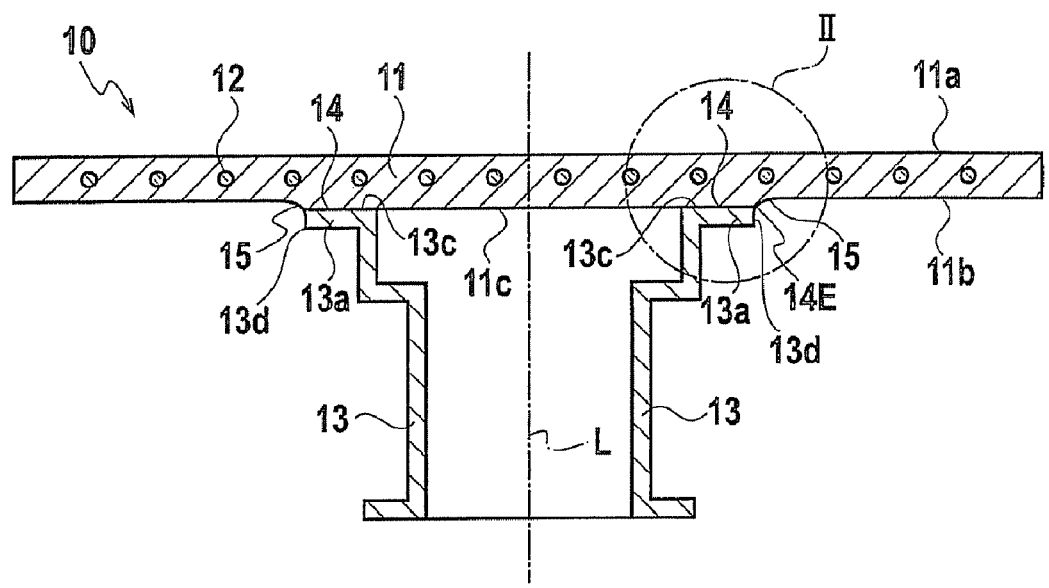
FIG. 1 is a schematic longitudinal cross-sectional view of an embodiment of a heating device according to the present invention.

FIG. 1 is a schematic longitudinal cross-sectional view of an embodiment of the heating device according to the present invention. The heating device 10 shown in this drawing includes, as a heating base, a ceramic base 11 made of disc-like ceramics. The ceramic base 11 has a planar heating surface 11a on which a heating object (for example, a semiconductor wafer; not shown) is to be mounted. A resistance heating element 12 is embedded in an inside of the ceramic base 11. Electric power is supplied from an external power supply (not shown) to the resistance heating element 12, whereby the resistance heating element 12 generates heat. By such heat generation of the resistance heating element 12, the ceramic base 11 is heated. The ceramic base 11 is heated, thus making it possible to heat the heating object mounted on the heating surface 11a of the ceramic base 11. To a back surface 11b of the ceramic base 11, which is an opposite side surface with the heating surface 11a, a shaft 13 as a support member that supports the ceramic base 11 is bonded. In the ceramic base 11, a plate thickness of the vicinity of a central portion on the back surface 11b is larger than in the vicinity of a peripheral portion thereon, and the shaft 13 is bonded to a surface 11c of the central portion of the back surface 11b.

The shaft 13 has a substantially cylindrical shape that is hollow, and preferably, is made of the same type of ceramics as that of the ceramic base 11. In an inner space of the shaft 13, a lead wire and a power feeding bar, which are for supplying the electric power to the resistance heating element 12 in the inside of the ceramic base 11, are arranged. Moreover, when the ceramic base 11 further includes an electrostatic electrode and a high frequency electrode, lead wires and the like, which are connected to these electrodes embedded in the ceramic base 11, are arranged in the inner space of the shaft 13.

On an end portion of the shaft 13 on a side where the shaft 13 is bonded to the ceramic base 11, a flange portion 13a is formed. In a state where an end surface 13c of the flange portion 13a, which is bonded to the ceramic base 11, and such a central surface 11c of the ceramic base 11 are brought into intimate contact with each other, the shaft 13 is bonded to the ceramic base 11 by solid-phase bonding or liquid-phase bonding.

Moreover, in the vicinity of an outer end 14E of a bonding interface 14 between the ceramic base 11 and the shaft 13, a concave surface portion 15 is formed, which smoothly connects the back surface 11b of the ceramic base 11 and an outer circumferential surface 13d of the flange portion 13a of the shaft 13 to each other.

Figure 2:
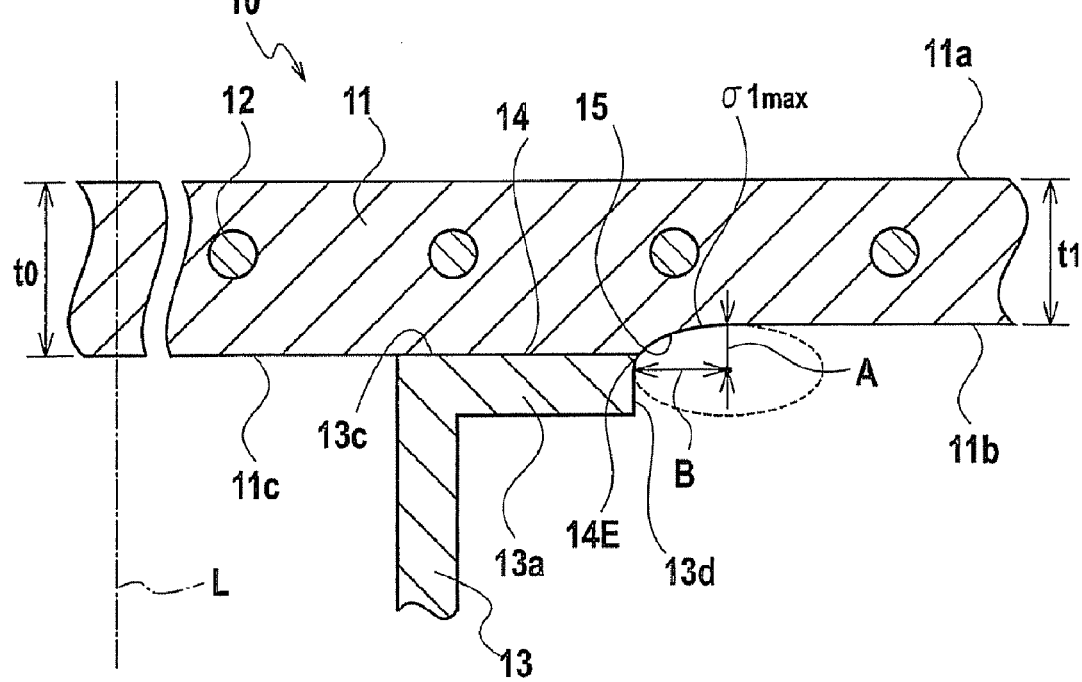
FIG. 2 is an enlarged longitudinal cross-sectional view of a main portion of FIG. 1.

An enlarged cross-sectional view of a region II in the vicinity of the concave surface portion 15 of the heating device 10 is shown in FIG. 2. The concave surface portion 15 has a shape that becomes a curved line of an arc of a ellipsoid on a cross section including an axis L of the shaft 13, that is, on a longitudinal cross section shown in FIG. 2. The minor axis direction of this ellipsoid is parallel to the axis L of the shaft 13, and the major axis direction thereof is perpendicular to the axis L of the shaft 13.

In the heating device of this embodiment, the concave surface portion 15 becomes such a curved surface that becomes the arc of the ellipsoid on the longitudinal cross section. Accordingly, a crack is more effectively suppressed from occurring on the concave surface portion 15. This will be described below in detail.

Figure 3:
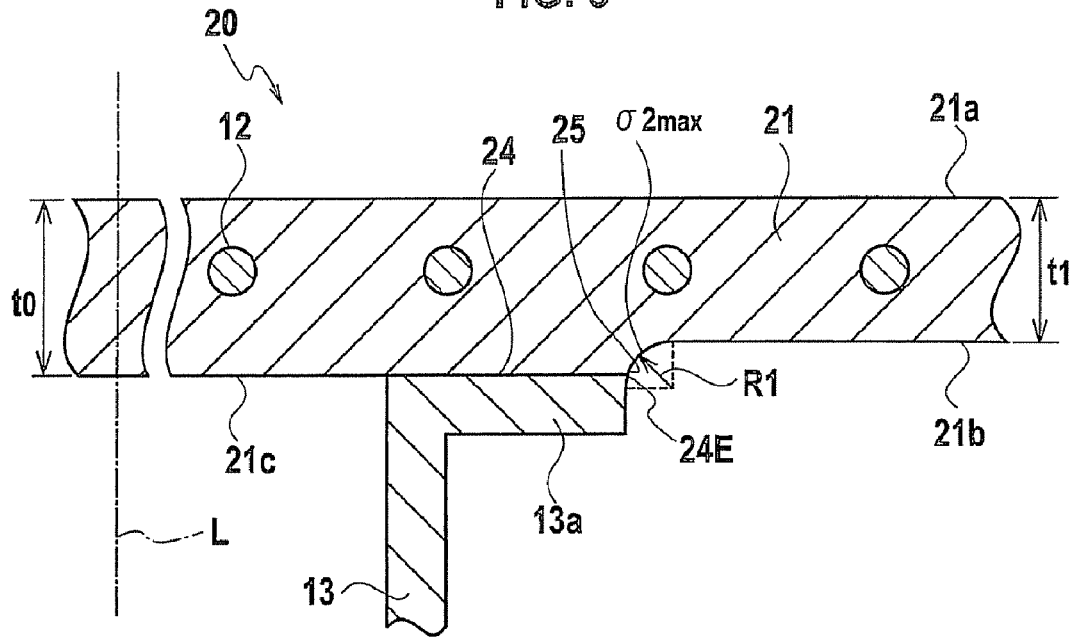
FIG. 3 is an enlarged cross-sectional view of a main portion of a heating device of a comparative example.

Also in the conventional heating device in which the rounded portion is formed in the vicinity of the bonded portion between the ceramic base and the shaft, the crack has sometimes occurred in this rounded portion. In accordance with the study of the inventors, the reason of the above is considered to be that a thermal stress caused at the time of heating or cooling the ceramic base becomes the maximum in this rounded portion. As a comparative example, FIG. 3 is a longitudinal cross-sectional view of the vicinity of the bonded portion of the conventional heating device including the rounded portion. In the heating device 20 shown in FIG. 3, the shaft 13 is bonded to a central surface 21c of a back surface 21b on an opposite side with a heating surface 21a in a ceramic base 21 in which the resistance heating element 12 is embedded. In the vicinity of an outer end 24E of a bonding interface 24 between the ceramic base 21 and the shaft 13, a rounded portion 25 is formed, which connects the back surface 21b of the ceramic base 21 and the flange portion 13a of the shaft 13 smoothly to each other with a fixed curvature radius R1. In the heating device 20 shown in FIG. 3, when the resistance heating body 12 embedded in the ceramic base 21 generates heat, though a portion of the heating surface 21a of the ceramic base 21 is heated uniformly, a temperature of a portion of the bonding interface 24 connected to the shaft 13 becomes lower than temperatures of other portions of the base 21 owing to heat transfer to the shaft 13 through the bonding interface 24. Hence, in the ceramic base 21, the thermal stress is caused in a radius direction of the ceramic base 21 by a temperature gradient in the base 21 concerned. A position on which the thermal stress is concentrated most is a position of a maximum stress portion σ2max located on a middle of the rounded portion 25. Therefore, the crack has sometimes occurred in the vicinity of the maximum stress portion σ2max on a surface of the rounded portion 25.

Figure 4:
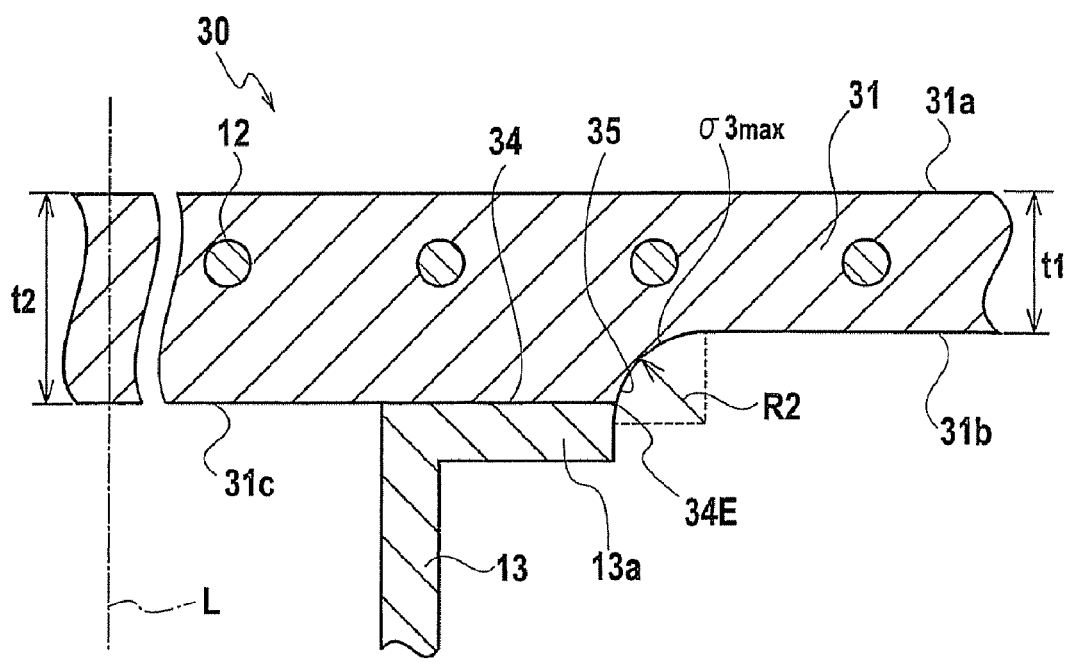
FIG. 4 is an enlarged cross-sectional view of a main portion of a heating device of another comparative example.

The thermal stress caused in the ceramic base 21 becomes larger as the curvature radius of the rounded portion 25 on the longitudinal cross section is being smaller. Accordingly, it is considered to increase the curvature radius of the rounded portion on the longitudinal cross section in order to reduce the thermal stress. As another comparative example, FIG. 4 is a longitudinal cross-sectional view of the vicinity of a bonded portion of a heating device 30, in which the curvature radius of the rounded portion is larger than that of the heating device 20 shown in FIG. 3. In the heating device 30 shown in FIG. 4, the shaft 13 is bonded to a central surface 31c of a back surface 31b on an opposite side with a heating surface 31a in a ceramic base 31 in which the resistance heating element 12 is embedded. In the vicinity of an outer end 34E of a bonding interface 34 between the ceramic base 31 and the shaft 13, a rounded portion 35 is formed, which connects the back surface 31b of the ceramic base 31 and the flange portion 13a of the shaft 13 smoothly to each other with a fixed curvature radius R2 larger than the curvature radius R1 of the rounded portion of FIG. 3.

In the heating device 30 shown in FIG. 4, the curvature radius R2 of the rounded portion 35 is larger than the curvature radius R1 of the rounded portion 25 of the heating device 20 shown in FIG. 3. Accordingly, a maximum stress σ3max of a middle portion of the rounded portion 35 becomes a value smaller than the maximum stress σ2max of the heating device 20 shown in FIG. 3. Hence, in the heating device 30 shown in FIG. 4, the occurrence of the crack is suppressed more than in the heating device 20 shown in FIG. 3. However, in the heating device 30 shown in FIG. 4, a thickness t2 of the ceramic base 31 is increased more than a thickness t0 of the ceramic base 21 shown in FIG. 3 in order to increase the curvature radius R2 of the rounded portion 35 more than the curvature radius R1 of the rounded portion 25 of the heating device shown in FIG. 3. Hence, in the heating device 30, since the thickness of the ceramic base 31 is large, a possibility that an internal defect may occur at the time of molding and firing the ceramic base 31 is increased, and as a result, a risk of the occurrence of the crack owing to the internal defect is increased.

In this connection, in the heating device 10 of this embodiment, which is shown in FIG. 1 and FIG. 2, the concave surface portion 15 becomes such a curved surface that becomes the arc of the ellipsoid on the longitudinal cross section, the minor axis direction of the ellipsoid is parallel to the axis direction of the shaft 13, and the major axis direction of the ellipsoid is perpendicular to the axis direction of the shaft 13. The heating device 10 of this embodiment includes the concave surface portion 15 as described above, whereby the curvature radius of the portion of the concave surface portion 15, which is in the vicinity of the portion connected to the back surface 11b of the ceramic base 11, is particularly increased. In such a way, the maximum stress σ1max of the thermal stress in the concave surface portion 15 can be set at a value smaller than the maximum stress σ3max in the rounded portion 35 of the heating device shown in FIG. 4. Therefore, the occurrence of the crack is suppressed more effectively. Moreover, the position of the maximum stress σ1max of the concave surface portion 15 is sufficiently apart from the outer end 14E of the bonding interface 14 between the ceramic base 11 and the shaft 13. Hence, the crack is suppressed from occurring in the outer edge 14E of the boding interface 14 by the maximum stress σ1max. Also in such a way, the occurrence of the crack is further suppressed in the heating device 10 of this embodiment. In addition, it is not necessary that the thickness t0 of the ceramic base 11 be increased as much as the thickness t2 of the ceramic base 31 of the heating device shown in FIG. 4. Hence, the risk of the occurrence of the crack owing to the internal defect caused by increasing the thickness t0 of the ceramic base 11 can be suppressed, and the occurrence of the crack is suppressed also in this point. The crack is suppressed by these ways, thus making it possible to enhance the reliability of the heating device.

In the concave surface portion 15, on the cross section including the axis of the shaft 13, that is, on the longitudinal cross section shown in FIG. 1 and FIG. 2, it is preferable that a ratio B/A of a major axis radius B of the ellipsoid with respect to a minor axis radius A thereof be 1.5 or more. The ratio B/A of the major axis radius B with respect to the minor axis radius A is 1.5 or more, whereby the maximum stress σ1max can be effectively reduced, and the position of the maximum stress σ1max can be spaced sufficiently apart from the outer end 14E of the bonding interface 14. Hence, the crack can be suppressed significantly. An upper limit of the ratio B/A of the major axis radius B of the ellipsoid with respect to the minor axis radius A thereof is not particularly limited from a viewpoint of suppressing the crack. The ratio B/A can be set within an appropriate range in consideration for a process margin of the concave surface portion 15, a heat capacity in the vicinity of the central portion of the ceramic base 21, and the like. In terms of the range, the upper limit of the ratio B/A can be preferably set at 10 or less, more preferably 5 or less.

It is preferable that a surface roughness of the concave surface portion 15 be 0.8 μm or less in a centerline average roughness Ra. By the research of the inventors, it has been found out that the crack is prone to occur when the surface roughness of the concave surface portion 15 is large even if the curvature of the surface is the same. This is considered to be because irregularities of the surface are prone to become breakage origins. The surface roughness of the concave surface portion 15 is 0.8 μm or less in the centerline surface roughness Ra, whereby the occurrence of the crack is effectively suppressed, thus making it possible to further enhance the reliability.

The minor axis radius A of the arc of the concave surface portion 15 is not particularly limited, and moreover, it is preferable that the minor axis radius A be approximately 1 to 10 mm though depending on the thickness t0 of the ceramic base 11. It is more preferable that the minor axis radius A be 2 to 9 mm. The formation of the concave surface portion 15 is performed by removing, by a grinding process, a portion of the ceramic base 11 having the thickness t0, which is other than the vicinity of the central portion thereof, and setting the peripheral side of the ceramic base 11 concerned at the thickness t1. Accordingly, in consideration for a margin for the grinding process, and the like, an appropriate value can be selected for the minor axis radius A.

The thickness t0 of the vicinity of the central portion of the ceramic base 11 is not particularly limited; however, is preferably within a range of 2 to 50 mm, more preferably within a range of 5 to 30 mm. In the heating device of the present invention, the concave surface portion 15 has the shape of the arc of the substantial ellipsoid on the longitudinal cross section. Accordingly, the thickness of the concave surface portion 15 does not have to be limited in order to absorb the stress concentrated thereon, and can be selected appropriately in accordance with other conditions.

Moreover, the shape of the arc of the ellipsoid in the heating device of the present invention is not limited to a shape of an arc of an ellipsoid in a strict meaning. In the heating device of the present invention, it is important that the cross-sectional shape of the concave surface portion 15 becomes a gentle arc in which a tangent line is on the back surface of the plate (that is, the ceramic base 11). Accordingly, a similar effect can be obtained even if the above-described shape of the arc is a line approximate to the arc of the ellipsoid, for example, a conic section, a hyperbola, a spline curve, and the like. Moreover, a shape error usually recognized at the time of industrially manufacturing the heating device is allowed.

As the material of the ceramic base 11, there are preferably: nitride ceramics such as those of aluminum nitride, silicon nitride, boron nitride, mullite, and sialon; silicon carbide; alumina; an alumina-silicon carbide composite material; and the like. Moreover, the material of the ceramic base 11 may be publicly known ceramic materials without being limited to the above. In order to impart high corrosion resistance to corrosive gas such as halogen series gas contained in the atmosphere at the time of using the heating device 10, aluminum nitride and alumina are particularly preferable.

From a viewpoint of absorbing the thermal stress as much as possible, it is preferable that the material of the shaft 13 be the same as the material of the ceramic base.

The heating device of the present invention is manufactured through the respective steps, which are: a fabrication step of the ceramic base 11; a fabrication step of the shaft 13; and a bonding step of the ceramic base 11 and the shaft 13. These respective steps can be performed by the law of the art.

EXAMPLE

[Evaluation of Shape of Concave Surface Portion]

A plurality of the heating devices were manufactured, in which the position and shape of each concave surface portion in the vicinity of the bonded portion between the ceramic base and the shaft were variously changed. Each of the heating devices was manufactured in such a manner that the ceramic base and the shaft were individually fabricated from AlN powder as a raw material by press molding and firing, and were thereafter bonded to each other by the solid-phase bonding method.

The plurality of heating devices were prepared, in which an outer diameter of each ceramic base was fixed at 348 mm, the thickness (t1 in FIG. 2, FIG. 3 and FIG. 4) of the peripheral portion thereof was fixed at 20 mm, and the shape of the concave surface portion and the thickness (t0 in FIG. 2 and FIG. 3 and t2 in FIG. 4) of the central portion of each ceramic base were variously changed. In each shaft of these heating devices, an outer diameter of the flange portion was 75 mm, an inner diameter thereof was 52 mm, and a thickness (length of an outer circumferential portion of the flange in the axis direction) thereof was 5 mm. Note that, in processing the concave surface portion, a grit number of a grindstone was set at #200, the number of revolutions of the grindstone was set at 6000 (rpm), and a feeding speed of the grindstone was set at 0.3 mm/min. After the process, the surface roughness Ra of the concave surface portion was 0.9 μm. Each of these heating devices was placed in a chamber that was set to an atmosphere containing corrosive gas with a pressure of 400 Torr. Subsequently, the heating device was heated up to 700° C. to be then subjected a continuous heating operation for 10 hours, was then cooled down to 200° C. once, and was heated up to 700° C. one more time. In such a way, a thermal test was conducted, and the thermal test was performed for predetermined periods. Thereafter, it was investigated whether or not the crack had occurred.

Results of the above are shown in Table 1.

concerned, it was found out that, by forming the concave surface portion into the ellipsoidal shape in cross section, it is possible to further enhance the reliability without increasing the thickness of the central portion of the ceramic base.

TABLE 1

| Section | Shape of concave surface | Size (mm) | B/A | Thickness of vicinity of central portion of ceramic base: t0 (mm) | Elapsed time | | | | |
|---|---|---|---|---|---|---|---|---|---|
| | | | | | One day | Half year | One year | One and half years | Two years |
| Comparative example 1 | Circular arc | R = 2 | — | 21 | Crack occurred | | | | |
| Comparative example 2 | Circular arc | R = 8 | — | 27 | No abnormality | Crack occurred | | | |
| Comparative example 3 | Ellipsoidal arc | A = 2, B = 2.4 | 1.2 | 21 | No abnormality | Crack occurred | | | |
| Example 1 | Ellipsoidal arc | A = 2, B = 3 | 1.5 | 21 | No abnormality | No abnormality | No abnormality | No abnormality | Crack occurred |
| Example 2 | Ellipsoidal arc | A = 2, B = 4 | 2 | 21 | No abnormality | No abnormality | No abnormality | No abnormality | No abnormality |
| Example 3 | Ellipsoidal arc | A = 2, B = 8 | 4 | 21 | No abnormality | No abnormality | No abnormality | No abnormality | No abnormality |
| Example 4 | Ellipsoidal arc | A = 2, B = 10 | 5 | 21 | No abnormality | No abnormality | No abnormality | No abnormality | No abnormality |

As understood from Table 1, in Comparative example 1, the concave surface portion in the vicinity of the bonded portion between the ceramic base and the shaft was formed into a shape of an arc of a perfect circle having a fixed curvature radius (2 mm) on the longitudinal cross section, and the crack occurred after one day elapsed. In Comparative example 2, the concave surface portion in the vicinity of the bonded portion between the ceramic base and the shaft was formed into a shape of an arc of a perfect circle having a fixed curvature radius (8 mm) on the longitudinal cross section, and this curvature radius was larger than that of Comparative example 1, and the crack occurred after a half year elapsed. Moreover, in Comparative example 2, the thickness of the vicinity of the central portion of the ceramic base became larger than that of Comparative example 1, and accordingly, the risk of the occurrence of the crack owing to the internal defect was increased. In Comparative example 3, the concave surface portion in the vicinity of the bonded portion between the ceramic base and the shaft was formed into a shape of an arc of the ellipsoid on the longitudinal cross section, and the ratio of the major axis radius B of the ellipsoid with respect to the minor axis radius A thereof was 1.2, and the crack occurred after a half year elapsed.

Meanwhile, Examples 1 to 4 are examples in each of which the concave surface portion has the shape of the arc of the ellipsoid on the longitudinal cross section. In accordance with Examples 1 to 4, when the ratio of the major axis radius B of the ellipsoid with respect to the minor axis radius A thereof was 1.5 or more, no abnormality was observed even after one and half years elapsed, and particularly excellent reliability was exhibited. By comparison of Example 3 with Comparative example 1 having the curvature radius (2 mm) equal to the minor axis radius (2 mm) of Example 3 concerned, it was found out that it is possible to further enhance the reliability by forming the concave surface portion into the ellipsoidal shape in cross section even if the thickness of the central portion was the same. Moreover, by comparison of Example 3 with Comparative example 2 having the curvature radius (8 mm) equal to the major axis radius (8 mm) of Example 4

[Evaluation of Surface Roughness]

A relationship between the surface roughness and bonding strength of the concave surface portion of the ceramic base was investigated. A heating surface used for this evaluation is the one having the same material and size as those of the heating device used in Example 2.

As the heating device for the evaluation, the one was used, in which the minor axis radius was 2 mm, the major axis radius was 3.0 mm, the thickness t0 of the vicinity of the central portion of the ceramic base was 21 mm, and the thickness t1 of the vicinity of the peripheral portion thereof was 20 mm.

Results of performing a finishing grinding process for the concave surface portion while variously changing a size of abrasion grains of the grindstone, a rotation speed of the grindstone and a feeding speed of the grindstone are shown in Table 2 together with the strength of the bonding interface and the surface roughness of the concave surface in the vicinity of the bonding interface. Note that the strength of the bonding interface was obtained by performing a cantilever bending test for a test piece cut out of the heating device for this evaluation.

TABLE 2

| Grit number of grindstone | Number of revolutions of grindstone | Feeding speed of grind stone (mm/min) | Strength (MPa) | Surface roughness (Ra) |
|---|---|---|---|---|
| 180 | 6000 | 0.2 | 250 | 1.2 |
| 200 | 6000 | 0.2 | 270 | 1 |
| 200 | 6000 | 0.3 | 280 | 0.9 |
| 325 | 6000 | 0.2 | 350 | 0.8 |
| 325 | 6000 | 0.3 | 360 | 0.7 |

From Table 2, it is understood that the strength was dramatically enhanced in such a manner that the centerline average roughness Ra was set at 0.8 μm or less by changing the processing conditions.

Next, in processing the concave surface portion in which the longitudinal cross section has the shape of the arc of the ellipsoid, such processing conditions that could allow the centerline average roughness Ra to become 0.8 μm were applied to fabricate a heating device having the same shape as that of Example 2 of Table 1, and a heating corrosion test was performed therefor under the same conditions as those in the evaluation of the shape of the concave surface portion, which has been described above. As a result, no crack occurred even after the elapse of two years. From this fact, it was understood that it is possible to further enhance the reliability of the heating device by setting the roughness Ra of the arc of the ellipsoid at 0.8 μm or less.

The description has been made above of the heating device of the present invention by using the embodiments and the drawings. However, the heating device of the present invention is not limited to the descriptions of the embodiments and the drawings, and a large number of modifications are possible within the scope without departing from the gist of the present invention. For example, the embodiment shown in FIG. 1 and FIG. 2 shows such an example where the outer end 14E of the bonding interface 14 between the ceramic base 11 and the shaft 13 is located on the arc between a major axis end portion and minor axis end portion of the concave surface portion 15 that forms the shape of the arc of the ellipsoid on the longitudinal cross section; however, the outer end 14E may be located at a position that coincides with the major axis end portion of the arc of the concave surface portion 15.

What is claimed is:

1. A heating device made of ceramics, comprising:
a plate-like heating base having a heating surface;
a hollow cylindrical support member bonded to a back surface of the heating base so that an axis direction thereof is perpendicular to the back surface; and
a concave surface portion connecting the back surface of the heating base and an outer surface of the support member smoothly to each other, said concave surface portion being formed at a location that includes a bonded portion between the heating base and the support member,
wherein on a cross section including an axis of the support member, the concave surface portion has a curved line of an arc of an ellipsoid having a minor axis and a major axis, wherein the minor axis direction is parallel to the axis direction of the support member, and in the concave surface portion, a ratio B/A of the radius, B, of the major axis of the ellipsoid with respect to the radius, A, of the minor axis of the ellipsoid is 1.5 to 5.0.

2. The heating device according to claim 1, wherein the concave surface portion has a centerline average surface roughness Ra between 0 and 0.8 μm.

* * * * *